United States Patent
Okuyama

(10) Patent No.: US 7,203,114 B2
(45) Date of Patent: Apr. 10, 2007

(54) SEMICONDUCTOR MEMORY WHICH PERFORMS THE REFRESH OPERATION INTERNALLY AND AUTOMATICALLY WITHOUT REFRESH COMMANDS FROM THE EXTERIOR

(75) Inventor: Yoshiaki Okuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/260,201

(22) Filed: Oct. 28, 2005

(65) Prior Publication Data

US 2006/0280015 A1   Dec. 14, 2006

(30) Foreign Application Priority Data

Jun. 14, 2005   (JP) ............................. 2005-173866

(51) Int. Cl.
*G11C 7/00* (2006.01)

(52) U.S. Cl. .................................. 365/222; 365/189.07

(58) Field of Classification Search ................ 365/222, 365/189.07
See application file for complete search history.

(56) References Cited

U.S. PATENT DOCUMENTS 5,467,315 A * 11/1995 Kajimoto et al. ........... 365/222
5,802,555 A * 9/1998 Shigeeda .................... 365/222
5,870,345 A    2/1999 Stecker
6,628,560 B2   9/2003 Dosaka

FOREIGN PATENT DOCUMENTS

| EP | 0 338 528 A | 10/1989 |
| GB | 2 261 755 A | 5/1993 |
| JP | 63-241790 A | 10/1988 |
| JP | 2003-30983 A | 1/2003 |

* cited by examiner

*Primary Examiner*—Tuan T. Nguyen
(74) *Attorney, Agent, or Firm*—Arent Fox PLLC

(57) ABSTRACT

An oscillator generates a refresh request signal periodically. A storing circuit changes a stored value by a predetermined value in response to the refresh request signal and returns the stored value by one in response to a refresh operation. A store control circuit, when a state detecting circuit detects a change of an operational state of a semiconductor memory, increases or decreases the predetermined value which the storing circuit uses. A refresh decision circuit outputs refresh signals of a number corresponding to the stored value until the stored value returns to an initial value. This makes it possible to change the frequency of the refresh operations according to a change of the operational state without changing an oscillation cycle of the oscillator. Without unnecessary oscillation of the oscillator, it is possible to decrease a standby current of the semiconductor memory.

8 Claims, 11 Drawing Sheets

US 7,203,114 B2

SEMICONDUCTOR MEMORY WHICH PERFORMS THE REFRESH OPERATION INTERNALLY AND AUTOMATICALLY WITHOUT REFRESH COMMANDS FROM THE EXTERIOR

CROSS REFERENCE TO RELATED APPLICATION

This application is based upon and claims the benefit of priority from Japanese Patent Application No. 2005-173866, filed on Jun. 14, 2005, the entire contents of which are incorporated herein by reference.

BACKGROUND OF THE INVENTION

1. Field of the Invention

The present invention relates to a semiconductor memory which requires a refresh operation periodically to retain data written in a dynamic memory cell. More particularly, the invention relates to a semiconductor memory which performs the refresh operation internally and automatically without requiring refresh commands from the exterior.

2. Description of the Related Art

In a pseudo SRAM having a dynamic memory cell and a DRAM having a self-refreshing mode, it is necessary to refresh the memory cell periodically with an internal circuit to retain data written in the memory cell. Specifically, this type of semiconductor memory incorporates a refresh timer which generates a refresh request signal for performing the refresh operation. Generally, a refresh timer includes an oscillator which generates an oscillation signal, and a frequency divider which periodically generates a refresh request signal by dividing the frequency of the oscillation signal.

The frequency of the oscillation signal is changed along with the fluctuation of fabricating conditions of the semiconductor (such as the fluctuation of the properties of the transistor and the like) and an operation environment of the semiconductor. For example, when the frequency of the oscillation signal becomes low and the refresh cycle is prolonged, there arises a possibility that data in a memory cell is lost before the refresh operation is performed. In order to prevent such a drawback, a frequency divider having a variable dividing ratio has been proposed (for example, Japanese Unexamined Patent Application Publication No. 2003-30983, Japanese Unexamined Patent Application Publication No. Sho 63-241790). By decreasing the dividing ratio when the frequency of the oscillation signal is low, it is possible to prevent the generation cycle of the refresh request signal from being prolonged. As a result, the drawback that the data in the memory cell is lost is prevented.

In recent years, a DRAM or a pseudo SRAM has been used as a work memory of a portable equipment. The portable equipment is required to exhibit the low power consumption to prolong a use time of a battery. Particularly, it is important that a standby current while the portable equipment is not in operation is low.

For lowering the power consumption of a refresh timer and the standby current, the frequency of the oscillator may be lowered. For example, by lowering the frequency of an oscillation signal to a value equal to the frequency of a refresh request signal, the power consumption of the refresh timer is largely reduced. However, to vary the frequency of the refresh request signal without using a frequency divider, it is necessary to change the oscillation frequency of the oscillator. To vary the frequency of the oscillation signal, a circuit scale of the oscillator is enlarged. Particularly, since the oscillator signal is used as a standard signal, the frequency of the oscillation signal is required to have a certain accuracy.

Therefore, this makes the circuit design of the oscillator complexed as well as the testing of the oscillator. Accordingly, it is undesirable to vary the oscillation frequency of the oscillator.

SUMMARY OF THE INVENTION

Accordingly, it is an object of the invention to reduce the power consumption of a refresh signal generation circuit which can vary the generation frequency of a refresh signal serving for a refresh operation, thus reducing a standby current of a semiconductor memory.

According to one aspect of the invention, the oscillator generates a refresh request signal periodically for refreshing dynamic memory cells. A storing circuit includes a holding part holding a stored value, and changes the stored value by a predetermined value so that it goes away from an initial value, in response to the refresh request signal. Further, the storing circuit changes the stored value by one so that it approaches to the initial value, in response to a refresh operation corresponding to the refresh request signal.

A state detecting circuit detects a change of a semiconductor memory from a first state to a second state and from the second state to the first state. A store control circuit increases a predetermined value used by the storing circuit in response to the detection of the change from the first state to the second state by the state detecting circuit. Further, the store control circuit decreases a predetermined value used by the storing circuit in response to the detection of the change from the second state to the first state by the state detecting circuit. A refresh decision circuit receives the stored value held in the holding part and outputs refresh signals of a number corresponding to the stored value until the stored value returns to the initial value. A core control circuit allows a memory core to perform a refresh operation in response to one of the refresh signals and allows the memory core to perform an access operation in response to an external access request.

In the invention, it is possible to set the number of the refresh operations performed in response to one refresh request signal during the second state larger than that of the refresh operations performed in response to one refresh request signal during the first state. Therefore, without changing the oscillation cycle of the oscillator, it is possible to change the frequency of the refresh operations in response to the change of the operational state of the semiconductor memory. Unnecessary oscillation of the oscillator can be prevented by using the oscillation signal generated by the oscillator as a refresh request signal without using a frequency divider. Accordingly, it is possible to reduce the power consumption of a circuit which generates the refresh signal for performing the refresh operation. The refresh operation is also necessary during a standby period of the semiconductor memory. Accordingly, the application of the invention can reduce a standby current particularly.

In a preferred example of one aspect of the invention, the state detecting circuit includes an arbiter. Upon receiving an external access request during the refresh operation performed in response to one of the refresh signals, the arbiter allows a core control circuit to shorten the refresh operation and start an access operation. The state detecting circuit detects the change from the first state to the second state from the shortening of the refresh operation. The store control circuit increases the predetermined value in response to the detection of the change from the first state to the second state.

A memory cell (a short restore memory cell) with the shortened refresh operation exhibits a small charge restore quantity. Therefore, data held in the short restore memory cell is easily lost compared to data held in the memory cell in which the refresh operation is completed. By increasing the frequency of the refresh operations at presence of the short restore memory cell, it is possible to shorten a time till the next refresh operation to the short restore memory cell. According to the invention, it is possible to increase the frequency of the refresh operations without changing the oscillation cycle of the oscillator. As a result, it is possible to prevent data held in the memory cell from being lost while minimizing the increase of the power consumption.

In another preferred example of one aspect of the invention, the state detecting circuit includes a refresh counter. The refresh counter performs a counting operation in synchronism with the refresh signal and generates a refresh address to specify a word line which is connected to the dynamic memory cells to be refreshed. In the invention, absence of the short restore memory cell is detected by detecting using the refresh counter that the word line corresponding to a shortened refresh operation is reselected for performing the refresh operation. From this, the state detecting circuit detects a change from the second state to the first state. The store control circuit decreases a predetermined value in response to the detection of the change from the second state to the first state. Accordingly, it is possible to decrease the frequency of the refresh operation again in response to the state that the short restore memory cell is not present.

In a preferred example of one aspect of the invention, the state detecting circuit includes an inversion detecting unit which detects the inversion of a logic level of an uppermost bit of a refresh address. The state detecting circuit detects that the refresh counter has completed one round operation when the inversion detecting unit detects the inversion of the logic level three times. Accordingly, the state detecting circuit detects a change from the second state to the first state. According to the invention, it is possible to detect that short restore memory cell is not present by monitoring only the uppermost bit.

Therefore, it is possible to realize the detection of the change from the second state to the first state with a simple circuit.

In a preferred example of one embodiment of the invention, the state detecting circuit includes a temperature detecting unit which detects a temperature of the semiconductor memory. The state detecting circuit detects a change from the first state to the second state when the temperature detected by the temperature detecting unit exceeds the preset value. The store control circuit increases the preset value in response to the detection of the change from the first state to the second state. In general, with an increase in the temperature of the semiconductor memory, a charge held in the dynamic memory cell is liable to decrease. Therefore, for preventing data held in the memory cell from being lost, it is necessary to increase the frequency of the refresh operations. In the invention, when the temperature rises, it is possible to increase the frequency of the refresh operation without changing the oscillation cycle of the oscillator. As a result, it is possible to prevent the data held in the memory cell from being lost while minimizing the increase of the power consumption.

In a preferred example of one aspect of the invention, the oscillator includes a current source, a capacitor, a refresh request generator and a discharge circuit. The capacitor is charged with a charge supplied from the current source, and generates an output voltage in accordance with an amount of the charge. The refresh request generator generates a refresh request signal when an output voltage exceeds a reference voltage. The discharge circuit discharges the charge of the capacitor in synchronism with the generation of the refresh request signal. The oscillator which generates an oscillation signal according to the charge amount of the capacitor needs to have a plurality of capacitors in order to vary the frequency of the oscillation signal. Then, the frequency of the oscillation signal is changed according to the capacitance value of the capacitor connected to the oscillator. To form the capacitor on the semiconductor substrate, a relatively large area is required. Therefore, to provide an oscillator with a frequency varying function, a layout size thereof is increased, and so is a chip size of the semiconductor memory. According to the invention, however, it is possible to change the frequency of the refresh operation without increasing the layout size of the oscillator.

In a preferred example of one aspect of the invention, the store control circuit includes a program circuit which sets the predetermined value to any one of a plurality of values. This makes it possible to desirably set the predetermined value according to a program value of the program circuit. Accordingly, when the electric characteristics of the semiconductor memory are changed due to a fluctuation in semiconductor fabricating conditions, the predetermined value is changeable in conformity with the change of the characteristics. This enables enhancement of a yield of the semiconductor memory.

In a preferred example of one aspect of the invention, a core control circuit outputs a refresh end signal in response to completion of the refresh operation. The storing circuit changes the stored value by one so that it approaches to the initial value, in synchronism with the refresh end signal. Changing the stored value in conformity with the end timing of the refresh operation makes it possible to prevent an erroneous decrease of the number of refresh operations. As a result, it is possible to prevent the storing circuit from erroneously operate, preventing data held in the memory cell from being lost.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
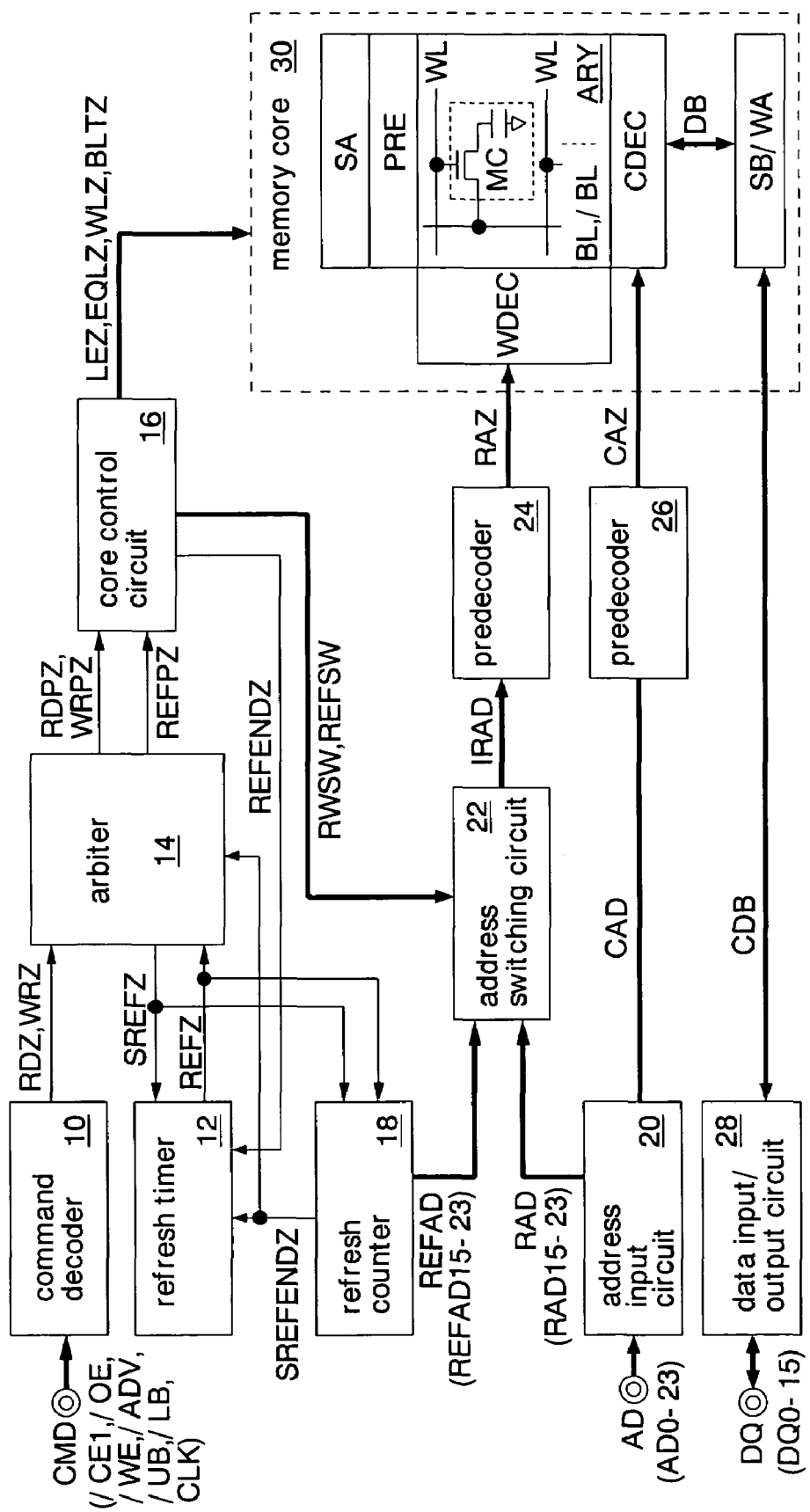
FIG. 1 is a block diagram showing a first embodiment of a semiconductor memory of the invention.

Hereinafter, embodiments of the invention are explained in conjunction with drawings. In the drawings, a signal line indicated by a bold line is constituted of a plurality of bits. A double circle in the drawings indicates an external terminal. A portion of a block to which the bold line is connected is constituted of a plurality of circuits. To indicate a signal line to which a signal is transmitted, symbol equal to the name of signal is used. The signal attached with "/" at a head indicates a negative logic. The signal attached with "Z" at a tail indicates a positive logic.

FIG. 1 shows one embodiment of a semiconductor memory of the invention. The semiconductor memory is formed using a CMOS technology and is constituted of a FCRAM (Fast Cycle RAM) having memory cells of DRAM (dynamic memory cells) and an interface of SRAM. The FCRAM having the interface of SRAM is a kind of pseudo SRAM and performs a refresh operation periodically inside a chip without receiving a refresh command from the exterior and holds data written in the memory cell. The FCRAM is operable in synchronism with a clock signal CLK and is used as a work memory mounted on a mobile phone, for example.

The FCRAM includes a command decoder 10, a refresh timer 12, an arbiter 14, a core control circuit 16, a refresh counter 18, an address input circuit 20, an address switching circuit 22, predecoders 24, 26, a data input/output circuit 28 and a memory core 30.

The command decoder 10 decodes a command signal CMD (an external access command signal) which is supplied through a command terminal CMD and outputs a read signal RDZ for performing a read operation and a write signal WRZ for performing a write operation. The command signal CMD includes a chip enable signal/CE, an output enable signal/OE, a write enable signal/WE, an address valid signal/ADV, an upper byte signal/UB, a lower byte signal/LB, and a clock signal CLK. The upper byte signal/UB is set at a low logic level to allow upper 8 bits of a data terminal DQ valid. The lower byte signal/LB is set at a low logic level to allow lower 8 bits of the data terminal DQ valid.

The refresh timer 12 outputs a refresh signal REFZ for performing the refresh operation at a predetermined cycle. The refresh timer 12 increases the generation frequency of the refresh signal REFZ from the reception of an activation of a short restore signal SREFZ to the reception of an activation of a short restore end signal SREFENDZ. The detail of the refresh timer 12 is explained in conjunction with FIG. 2.

The arbiter 14 compares the transition edges of the read signal RDZ or the write signal WRZ with those of the refresh signal REFZ and determines whether these signals conflict with each other and decides which of the access operations (read operation and write operation) and the refresh operation is performed with priority. When the arbiter 14 assigns the priority to the access operation, a read start signal RDPZ or a write start signal WRPZ is outputted in response to the read signal RDZ or the write signal WRZ. Here, the arbiter 14 temporarily holds a refresh signal REFZ and outputs an refresh start signal REFPZ in synchronism with the completion of the access operation.

Further, the arbiter 14, when the priority is assigned to the refresh operation, outputs the refresh start signal REFPZ in response to the refresh signal REFZ. Here, the arbiter 14 temporarily holds the read signal RDZ or the write signal WRZ and outputs the read start signal RDPZ or the write start signal WRPZ in synchronism with the completion of the refresh operation.

Further, when receiving the read signal RDZ or the write signal WRZ immediately after outputting the refresh start signal REFPZ, the arbiter 14 outputs the read start signal RDPZ or the write start signal WRPZ and activates the short restore signal SREFZ in order to allow the core control circuit 16 to shorten and terminate the refresh operation and to perform the access operation. That is, when the external access command is received during the refresh operation, the refresh operation is shortened and the access operation is performed. The short restore signal SREFZ is held at a high logic level until the short restore end signal SREFENDZ is activated.

The activation period of the short restore signal SREFZ is a period in which the refresh operation is shortened and a memory cell having an insufficient charge restore quantity (short restore memory cell) exists. An operational state of the FCRAM during this period is referred to as a second state. The inactivation period of the short restore signal SREFZ is a period in which a charge restore quantity to all memory cells is sufficient and the short restore memory cell does not exist. An operational state of the FCRAM during this period is referred to as a first state. The first state and the second state are indicated by the low logic level and the high logic level of the short restore signal SREFZ. That is, the arbiter 14 functions as a state detecting circuit which detects a change of the operational state of the FCRAM from the first state to the second state due to the shortening of the refresh operation.

The core control circuit 16 outputs the read/write switch signal RWSW in synchronism with an output of the read start signal RDPZ or the write start signal WRPZ, and outputs the refresh switch signal RFSW in synchronism with the refresh start signal REFPZ. Further, the core control circuit 16 outputs, to allow the memory core 30 to perform the read operation, the write operation or the refresh operation upon receiving the read start signal RDPZ, the write start signal WRPZ or the refresh start signal REFPZ, a sense amplifier activation signal LEZ, an equalizing signal EQLZ, a word line activation signal WLZ and a bit line transfer signal BLTZ. The sense amplifier activation signal LEZ is outputted for activating the sense amplifier of a sense amplifier part SA. The equalizing signal EQLZ is outputted for equalizing a pair of bit lines BL,/BL so as to set a precharged voltage. The word line activation signal WLZ is outputted for selecting any one of word lines WL in response to a row address signal RAD and a refresh address signal REFAD. The bit line transfer signal BLTZ is outputted for connecting the pair of bit lines BL,/BL to the sense amplifier.

The refresh counter 18 performs a counting operation in synchronism with the refresh signal REFZ and sequentially generates the refresh address signal REFAD indicative of the memory cells MC to be refreshed. To be more specific, the refresh address REFAD designates the word line WL which is connected with the memory cells MC to be refreshed. Further, the refresh counter 18, when a logic level of an uppermost bit REFAD23 of the refresh address REFAD is changed three times after the short restore signal SREFZ is activated, activates the short restore end signal SREFENDZ (pulse signal). The refresh counter 18 includes an inversion detecting part not shown in the drawings for detecting the inversion of the logic level of the uppermost bit REFAD23.

Due to the inversion of the logic level of the uppermost bit REFAD23 three times, it is detected that the refresh address REFAD has completed one round operation after receiving the activation of the short restore signal SREFZ. Accordingly, it is detected that the word line WL whose refresh operation is interrupted is again selected for the usual refresh operation and it is also detected that the short restore memory cell with the insufficient charge restore quantity no more exists. That is, the refresh counter 18 functions as a state detecting circuit which detects that the refresh address REFAD performs the one round operation due to the change of the logic level of the uppermost bit REFAD23 of the refresh address REFAD three times and, based on such detection, detects that the operational state of the FCRAM is changed from the second state to the first state. By monitoring only the uppermost bit REFAD23 of the refresh address REFAD, it is possible to easily detect that the short restore memory cell no more exists. Accordingly, the detection of the change from the second state to the first state can be realized with a simple circuit.

An address input circuit 20 receives an address signal AD (AD0-23) through an address terminal AD and outputs the received signal as a row address signal RAD (upper address; AD15-23) and a column address signal CAD (lower address). Here, the FCRAM is an address non-multiplex type memory which receives the upper address and the lower address simultaneously.

The address switching circuit 22, when the refresh operation is performed, outputs the refresh address signal REFAD as an internal row address signal IRAD in synchronism with the refresh switch signal RFSW. The address switching circuit 22, when the read operation or the write operation is performed, outputs the row address signal RAD as the internal row address signal IRAD in synchronism with the read/write switch signal RWSW.

The predecoder 24 decodes the internal row address signal IRAD and generates a row decoding signal RAZ. The predecoder 26 decodes the column address signal CAD and generates a column decoding signal CAZ.

The data input/output circuit 28 receives the read data from the memory cell MC through a common data bus CDB and outputs the received data to a data terminal DQ (DQ0-15). Further, the data input/output circuit 28 receives the written data through a data terminal DQ and outputs the received data to the common data bus CDB.

The memory core 30 includes a memory cell array ARY, a word decoder part WDEC, a sense amplifier part SA, a column decoder part CDEC, a read amplifier part RA and a write amplifier part WA. The memory cell array ARY includes a plurality of volatile dynamic memory cells MC, a plurality of word lines WL which are connected to the dynamic memory cells MC, and a plurality of pair of bit lines BL,/BL.

Each memory cell MC is equal to a memory cell of DRAM in general and includes a capacitor for retaining data as a charge and a transfer transistor which is arranged between the capacitor and the bit line BL (or/BL). A gate of the transfer transistor is connected to the word line WL. When the word line WL is selected, any one of the read operation, the write operation and the refresh operation is performed. The memory cell array ARY, after any one of the read operation, the write operation and the refresh operation is performed, performs the precharge operation to precharge the bit lines BL,/BL to a predetermined voltage in synchronism with the equalizing signal EQLZ.

The word decoder part WDEC, upon receiving the word line activation signal WLZ of high logic level, selects any one of word lines WL in response to the row decoding signal RAZ and changes the selected word line WL to the high logic level. The column decoder part CDEC, in response to the column decoding signal CAZ, outputs a column line signal which turns on a column switch for connecting the bit lines BL,/BL and the data bus DB.

The sensor amplifier part SA includes a plurality of sense amplifiers. Each sense amplifier is operated in synchronism with the sense amplifier activation signal LEZ and amplifies a signal quantity of the data on the bit lines BL,/BL. The data which is amplified by the sense amplifier is transmitted to the data bus DB through the column switch during the read operation and is written in the memory cell MC through the bit lines BL,/BL during the write period.

The read amplifier part SB includes a plurality of read amplifiers. Each read amplifier amplifies a signal quantity of read data on the data bus DB and outputs the amplified read data to the common data bus CDB. The write amplifier part WA includes a plurality of write amplifiers. Each write amplifier amplifies a signal quantity of written data on the common data bus CDB and outputs the amplified written data to the data bus DB.

Figure 2:
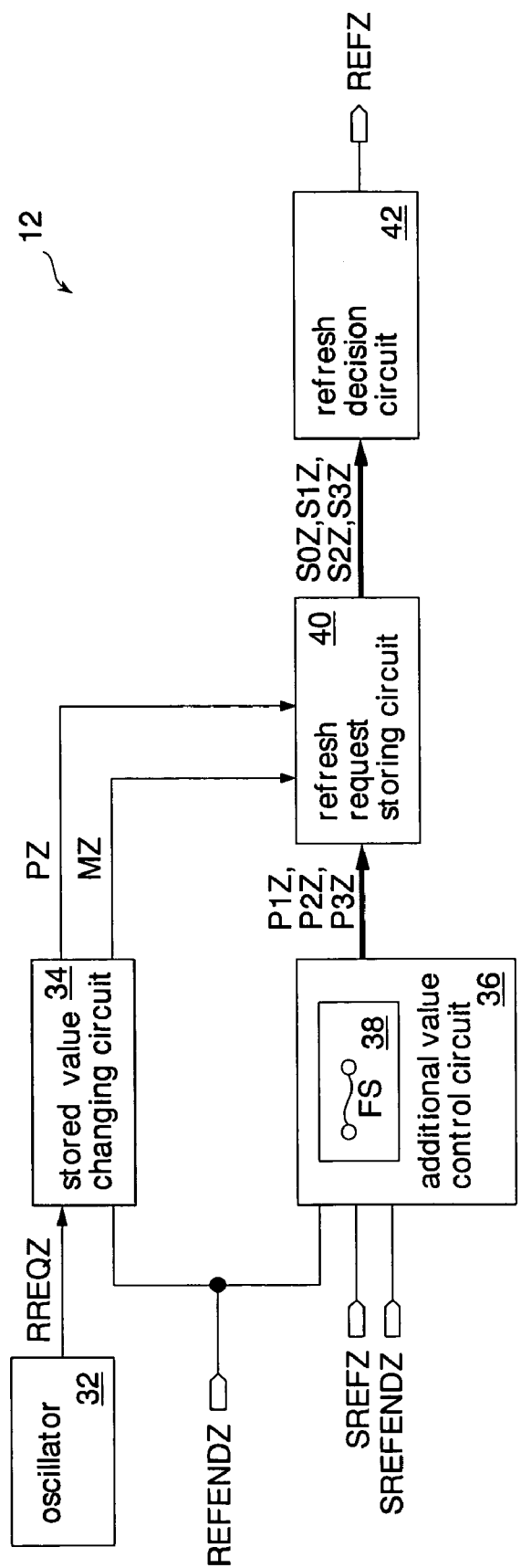
FIG. 2 is a block diagram showing the detail of a refresh timer shown in FIG. 1.

FIG. 2 shows the detail of the refresh timer 1 2 shown in FIG. 1. The refresh timer 12 includes an oscillator 32, a stored value changing circuit 34, an additional value control circuit 36, a refresh request storing circuit 40 and a refresh decision circuit 42.

The oscillator 32 generates a refresh request signal RREQZ periodically. For example, the refresh request signal RREQZ is generated for every 6 microseconds. The detail of the oscillator 32 is explained in conjunction with FIG. 3. The stored value changing circuit 34 outputs a plus signal PZ in response to the refresh request signal RREQZ and outputs a minus signal MZ in response to the refresh end signal REFENDZ.

The additional value control circuit 36 includes a program circuit 38 having a fuse FS and activates any one of additional value signals P1Z, P2Z and P3Z. The fuse FS in the program circuit 38 is cut when necessary in a test process which is performed after fabricating the FCRAM. The additional value control circuit 36 activates the additional value signal P1Z when the short restore signal SREFZ is not activated (during the first state).

When the fuse FS is not cut, the additional value control circuit 36 deactivates the additional value signal P1Z in response to the activation of the short restore signal SREFZ and activates the additional value signal P2Z (the second state). When the fuse FS is cut, the additional value control circuit 36 deactivates the additional value signal P1Z in response to the activation of the short restore signal SREFZ and activates the additional value signal P3Z (the second state). Further, the additional value control circuit 36, after the short restore end signal SREFENDZ is activated, deactivates the additional value signal P2Z (or P3Z) in synchronism with the activation of the refresh end signal REFENDZ and activates the additional value signal P1Z.

The refresh request storing circuit 40 includes a holding part for 4 bits not shown in the drawing which holds stored values S0Z, Z1Z, S2Z and S3Z. The refresh request storing circuit 40, during the additional value signal P1Z is activated, increases the stored value held in the holding part by "1" in synchronism with the plus signal PZ and decreases the stored value held in the holding part by "1" in synchronism with the minus signal MZ. The stored values held in the holding part are outputted as stored value signals S0Z, Z1Z, S2Z and S3Z of 4 bits (S0Z having a low-order bit).

In the same manner, the refresh request storing circuit 40, during the additional value signal P2Z is activated, increases the stored value by "2" in synchronism with the plus signal PZ and decreases the stored value by "1" in synchronism with the minus signal MZ. Further, the refresh request storing circuit 40, during the additional value signal P3Z is activated, increases the stored value by "3" in synchronism with the plus signal PZ and decreases the stored value by "1" in synchronism with the minus signal MZ.

In this manner, the additional value signals P1Z to P3Z indicate increments (predetermined values) of the stored values which are increased in response to the refresh request signal RREQZ. That is, the additional value control circuit 36 functions as a store control circuit which changes the increment (predetermined value) of the stored value which the refresh request storing circuit 40 uses into any one of "1", "2", "3". To be more specific, the additional value control circuit 36 increases, in response to the change of the FCRAM from the first state to the second state, the increment of the stored value from "1" to "2" or from "1" to "3". Further, the additional value control circuit 36 decreases, in response to the change of the FCRAM from the second state to the first state, the increment of the stored value from "2" to "1" or from "3" to "1".

When the fuse FS is not cut, the increment of the stored value is increased from "1" to "2". When the fuse FS is cut, the increment of the stored value is increased from "1" to "3". Accordingly, when the electric characteristic of the FCRAM is changed due to the fluctuation of the semiconductor fabricating conditions, it is possible to freely change the increment of the stored value in conformity with the change of the electric characteristic. Accordingly, it is possible to enhance a yield of the FCRAM.

The stored value changing circuit 34 and the refresh request storing circuit 40 function as a storing circuit which increases the stored value by the predetermined value indicated by the additional value signal P1Z to P3Z from the initial value (for example, "0") in response to the refresh request signal RREQZ and decreases the stored value by "1" in response to the refresh end signal REFENDZ (completion of the refresh operation in response to the refresh request signal RREQZ).

Here, in this embodiment, the initial value of the stored value is set to "0". The stored value is increased in response to the refresh request signal RREQZ and is decreased in response to the refresh end signal REFENDZ. However, the initial value may be set to a value other than "0" and the increase and the decrease of the stored value may be reversed.

The refresh decision circuit 42, when the binary number indicated in the stored values S3Z-S0Z exhibits the positive number, sequentially activates the refresh signal REFZ by the number of times corresponding to the positive number. That is, the refresh signal REFZ is outputted by the number of times corresponding to the stored number until the stored value returns to the initial value. The activation interval of the refresh signal REFZ is set to an interval which allows the semiconductor memory to properly perform the precharge operation after the refresh operation. With the use of the stored values S3Z-S0Z, the number of refresh operations which are not performed can be held up to 15 times.

Figure 3:
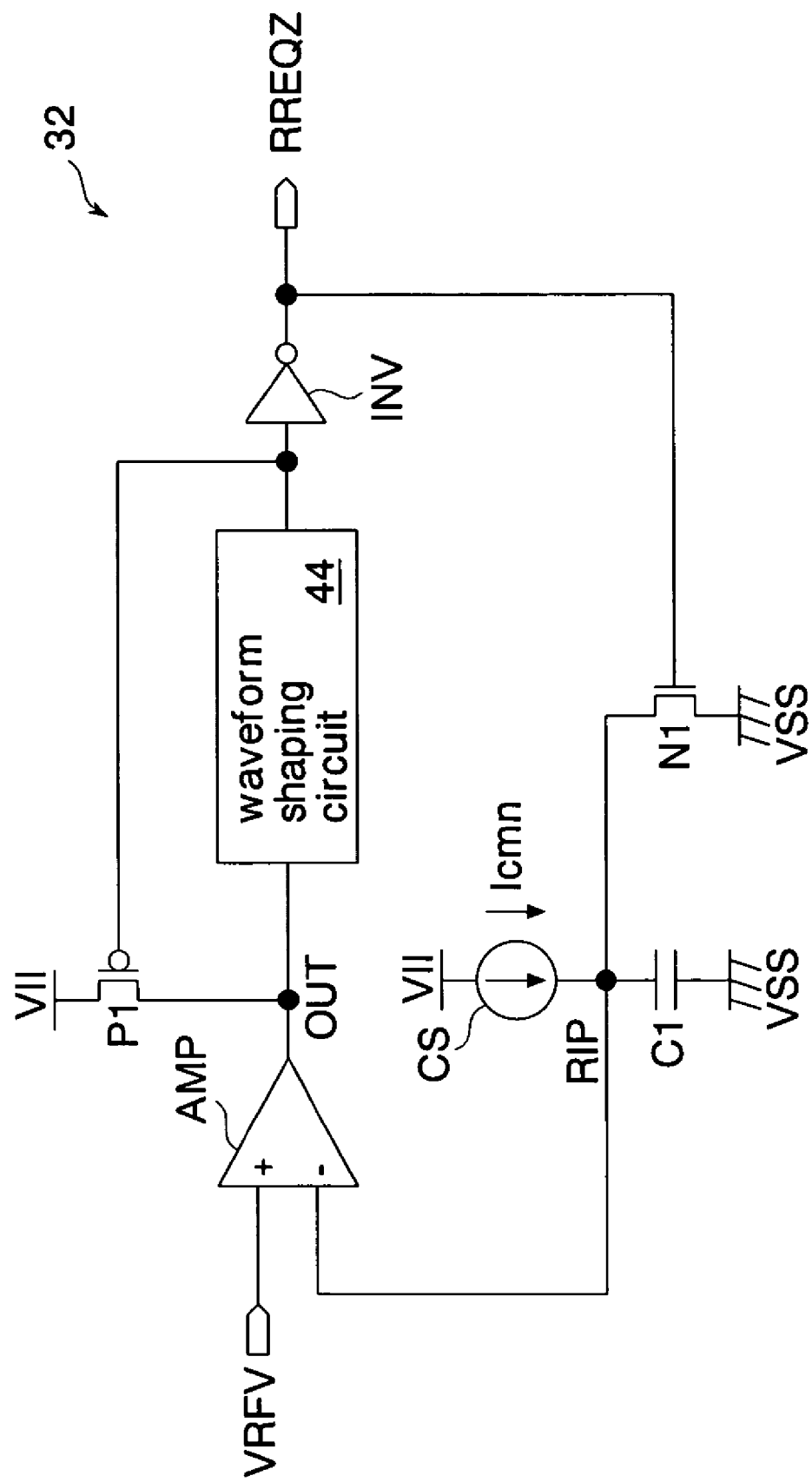
FIG. 3 is a circuit diagram showing the detail of an oscillator shown in FIG. 2.

FIG. 3 shows the detail of the oscillator 32 shown in FIG. 2. The oscillator 32 includes a differential amplifier AMP, a waveform shaping circuit 44, a pMOS transistor P1, an inverter INV, an nMOS transistor N1, a current source CS and a capacitor C1. The differential amplifier AMP compares a magnitude of a reference voltage Vrfv and a magnitude of a charged voltage RIP of the capacitor C1 and outputs an output voltage OUT corresponding to a comparison result. The waveform shaping circuit 44 delays a waveform of the output voltage OUT by a predetermined delay quantity. The inverter INV inverts the waveform of the delayed output voltage OUT and outputs the output voltage OUT as the refresh request signal RREQZ. The differential amplifier AMP, the waveform shaping circuit 44 and the inverter INV function as a refresh request generator which generates the refresh request signal RREQZ when the charged voltage RIP exceeds the reference voltage VREF.

The PMOS transistor P1, when an output of the waveform shaping circuit 44 assumes a low logic level state (during a period in which the refresh request signal RREQZ assumes a high logic level), resets an output node OUT of the differential amplifier AMP to the high logic level (internal supply voltage VII). The nMOS transistor N1 resets a node RIP of the capacitor C1 to the low logic level (ground voltage VSS) during the period in which the refresh request signal RREQZ assumes the high logic level. The nMOS transistor N1 functions as a discharge circuit which discharges the charge of the capacitor C1 in synchronism with the generation of the refresh request signal RREQZ. In response to a fact that the output node OUT assumes the high logic level, after a lapse of a predetermined delay quantity, the refresh request signal RREQZ returns to the low logic level.

The current source CS and the capacitor C1 are connected in series between the internal supply line VII and the ground line VSS via the node RIP. The capacitor C1 is charged with an electric current Icmn supplied from the current source CS. Here, the internal supply voltage VII is generated by lowering an external supply voltage VDD using an inner voltage generating circuit not shown in the drawing. The internal supply voltage VII is held at a fixed value without being influenced by the external supply voltage VDD and an operation temperature of the FCRAM.

Figure 4:
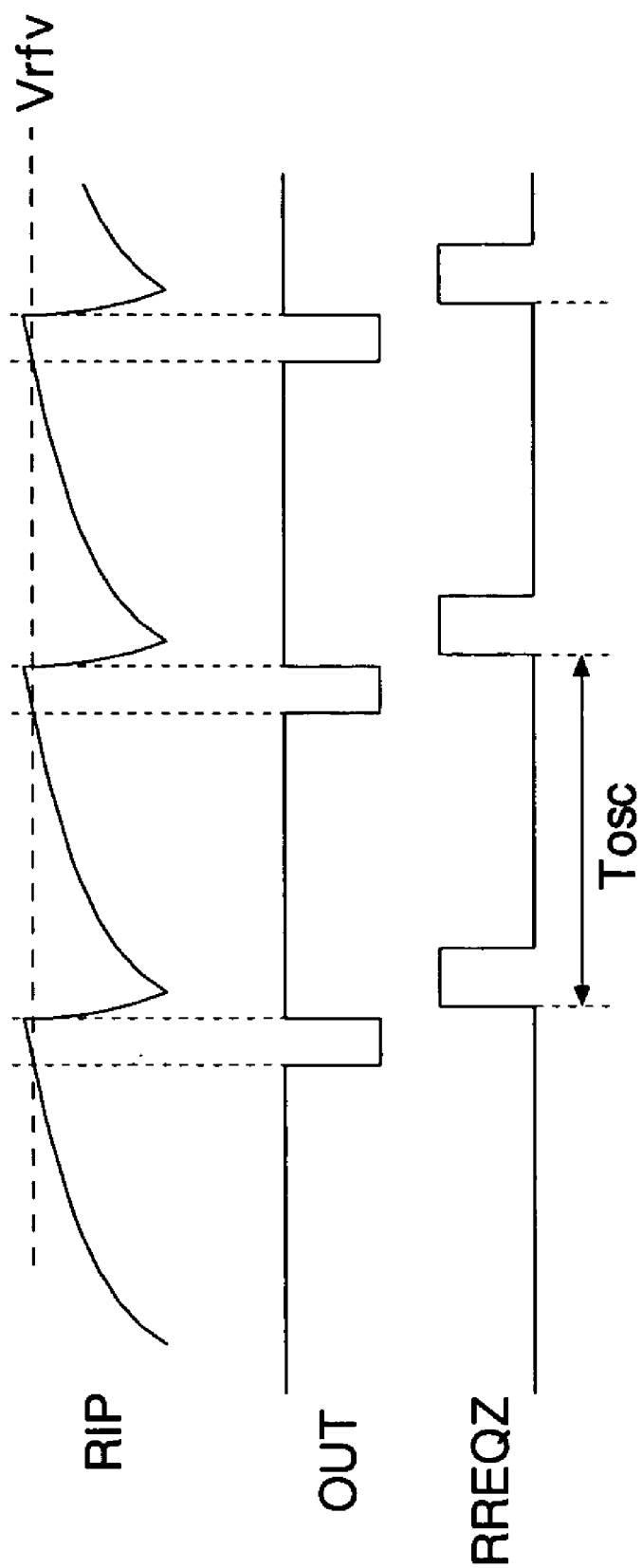
FIG. 4 is a waveform diagram showing an operation of the oscillator shown in FIG. 3.

FIG. 4 shows an operation of the oscillator 32 shown in FIG. 3. The differential amplifier AMP sets the output node OUT to the high logic level during a period in which the charged voltage RIP of the capacitor C1 is lower than the reference voltage Vrfv. The differential amplifier AMP changes the output node OUT to a low logic level when the charged voltage RIP of the capacitor C1 becomes higher than the reference voltage Vrfv. Then, the oscillator 32 outputs the refresh request signal RREQZ having a predetermined pulse width in synchronism with a rise edge of the output node OUT.

Due to the change of the refresh request signal RREQZ to the high logic level, the nMOS transistor N1 and the pMOS transistor P1 are turned on and the node RIP and the node OUT are respectively reset to the low logic level and the high logic level. The differential amplifier AMP, when the voltage of the node RIP becomes lower than the reference voltage Vrfv, sets the output node OUT to the high logic level. By repeating the above-mentioned operation, the refresh request signal RREQZ is outputted at a constant cycle Tosc. The cycle Tosc is, by setting a capacitance value of the capacitor C1 as C, expressed by a following formula (1). In this embodiment, the capacitance value of the capacitor C1 is, as mentioned above, designed to a value which sets the cycle of the refresh request signal RREQZ to 6 microseconds.

$$Tosc = (C \times Vrfv)/Icmn \qquad (1)$$

Figure 5:
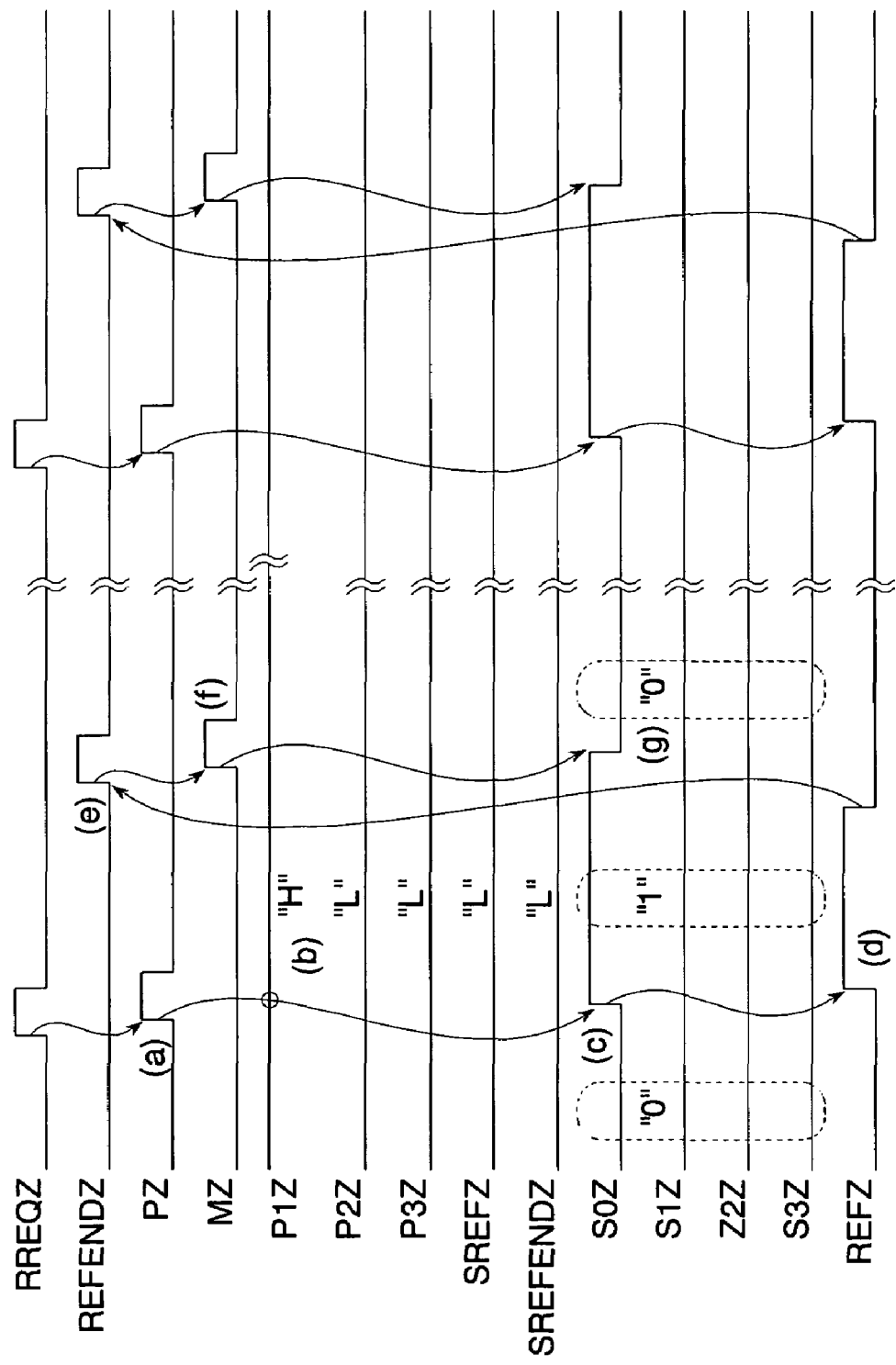
FIG. 5 is a timing chart showing a refresh operation in a first state of the invention.

FIG. 5 shows the refresh operation in the first state in which the short restore memory cell is not present in the invention. The refresh operation in the first state is equal irrespective of the state of the fuse FS in the program circuit 38. In FIG. 5, the refresh operation is performed without competing with the access operation. In the first state, the short restore signal SREFZ and the short restore end signal SREFENDZ are held at the low logic level. The stored value changing circuit 34 outputs the plus signal PZ in response to the refresh request signal RREQZ which is generated every 6 microseconds (FIG. 5(a)).

The additional value control circuit 36 activates the additional value signal P1Z to "H" (FIG. 5(b)). Accordingly, the refresh request storing circuit 40 increases the storage value by "1" in synchronism with the plus signal PZ and changes the storage value S3Z-S0Z from "0" to "1" (FIG. 5(c)). The refresh decision circuit 42 activates the refresh signal REFZ in response to "1" of the storage value S3Z-S0Z (FIG. 5(d)). The activation period of the refresh signal REFZ is substantially equal to the refresh operation time. Then, the refresh operation is performed.

The core control circuit 16 shown in FIG. 1 outputs a refresh end signal REFENDZ in synchronism with the completion of the refresh operation (FIG. 5(e)). The stored value changing circuit 34 outputs a minus signal MZ in response to the refresh end signal REFENDZ (FIG. 5 (f)). The refresh request storing circuit 40 decreases the stored value by "1" in synchronism with the minus signal MZ and changes the stored value S3Z-S0Z from "1" to "0" (FIG. 5(g)). Accordingly, the refresh signal REFZ is not activated hereinafter. That is, in the first state, the refresh signal REFZ is activated only one time in response to one refresh request signal RREQZ. The above-mentioned operation is performed every time the refresh request signal RREQZ is generated.

Figure 6:
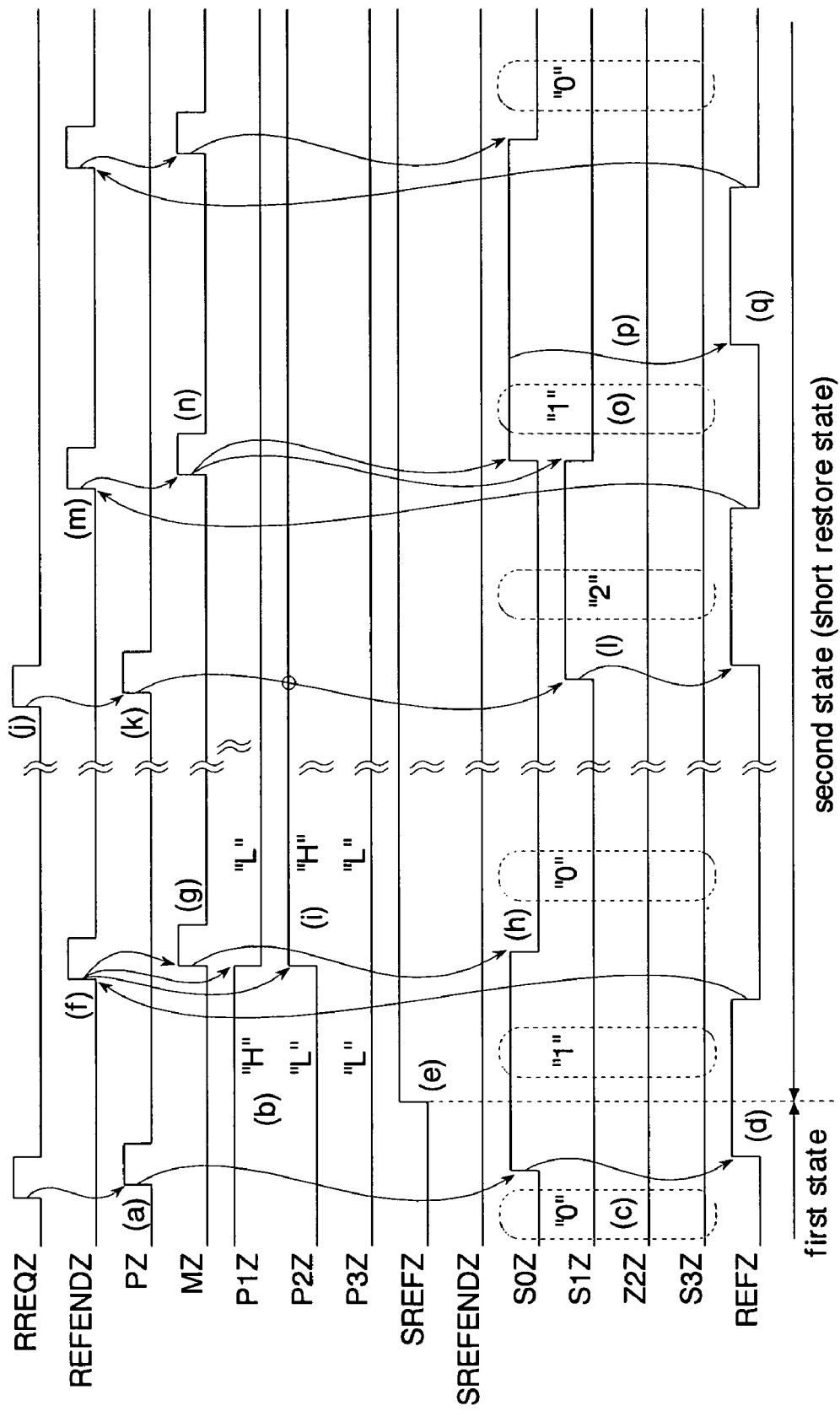
FIG. 6 is a timing chart showing a refresh operation when the operational state of the FCRAM is changed from a first state to a second state in the invention.

FIG. 6 shows the refresh operation when the operational state of the FCRAM is changed from the first state to the second state according to the invention. That is, FIG. 6 shows an example in which the access request is supplied during the refresh operation and the short restore operation which shortens the refresh operation is performed.

First of all, in the same manner as the operation shown in FIG. 5, the refresh operation is started (FIG. 6(a) to (d)).

The arbiter 14 shown in FIG. 1 shortens the refresh operation in response to the access request supplied during the refresh operation and activates the short restore signal SREFZ (FIG. 6(e)). Due to the activation of the short restore signal SREFZ, the operational state of the FCRAM is changed from the first state to the second state. That is, the FCRAM assumes the short restore state in which the short restore memory cell exists.

In synchronism with the completion of the refresh operation, the refresh end signal REFENDZ is outputted (FIG. 6(f)). In response to the refresh end signal REFENDZ, the minus signal MZ is outputted (FIG. 6(g)) and the stored value S3Z-S0Z returns to "0" (FIG. 6(h)). In this example, the fuse FS of the additional value control circuit 36 shown in FIG. 2 is not cut. Accordingly, the additional value control circuit 36 deactivates the additional value signal P1Z to "L" in response to the refresh end signal REFENDZ and activates the additional value signal P2Z to "H" (FIG. 6(i)).

Accordingly, in the succeeding operation, the stored value S3Z-S0Z is changed from "0" to "2" in response to the plus signal PZ.

Next, the refresh request signal RREQZ is outputted (FIG. 6(j)) and the plus signal PZ is outputted (FIG. 6(k)). The refresh request storing circuit 40 increases the stored value by "2" in response to the additional value signal P2Z of high logic level in synchronism with the plus signal PZ. Accordingly, the stored value S3Z-S0Z is changed from "0" to "2" (FIG. 6(l)). Thereafter, the refresh operation is operated in the same manner as mentioned previously. In synchronism with the completion of the refresh operation, the refresh end signal REFENDZ is outputted (FIG. 6(m)) and the minus signal MZ is outputted (FIG. 6(n)). The refresh request storing circuit 40 decreases the stored value by "1" in synchronism with the minus signal MZ and changes the stored value S3Z-S0Z from "2" to "1" (FIG. 6(o)).

The refresh decision circuit 42 reads out the stored value S3Z-S0Z after a lapse of a predetermined time from the completion of the refresh operation (FIG. 6(p)). The refresh decision circuit 42, since the stored value S3Z-S0Z is not "0", activates the refresh signal REFZ again (FIG. 6(q)). Accordingly, the refresh operation is performed again.

In this manner, when the FCRAM assumes the short restore state (second state), the refresh operation is performed twice in response to one refresh request signal RREQZ. Accordingly, in the short restore state in which the memory cell having the insufficient charge restore quantity exists, it is possible to increase the frequency of the refresh operation. That is, the time until the next refresh operation is performed with respect to the memory cell having the insufficient charge restore quantity can be shortened and hence, it is possible to prevent data held in the memory cell from being lost.

Here, when the fuse FS is cut and the additional value control circuit 36 activates the additional value signal P3Z, the refresh operation is performed three times in response to one refresh request signal RREQZ. For example, when it is necessary to increase the frequency of the refresh operation in the short restore state due to the change of the electric characteristic of the FCRAM attributed to the fluctuation of the semiconductor fabricating condition, the fuse FS is cut. In this manner, by changing the increment (predetermined value) of the stored value in conformity with the change of the electric characteristic of the FCRAM, it is possible to increase a yield of the FCRAM.

In this embodiment, without changing the frequency of the refresh request signal RREQZ which is outputted from the oscillator 32, it is possible to change the frequency of the refresh operation. Even when the refresh timer 12 has no frequency divider, it is unnecessary to change the oscillation cycle of the oscillator 32 and hence, it is unnecessary to form an extra capacitor for changing the frequency cycle of the oscillator 32. Accordingly, the frequency of the refresh operation can be changed without increasing a layout size of the oscillator 32. As a result, it is possible to prevent the increase of a chip size of the FCRAM.

Figure 7:
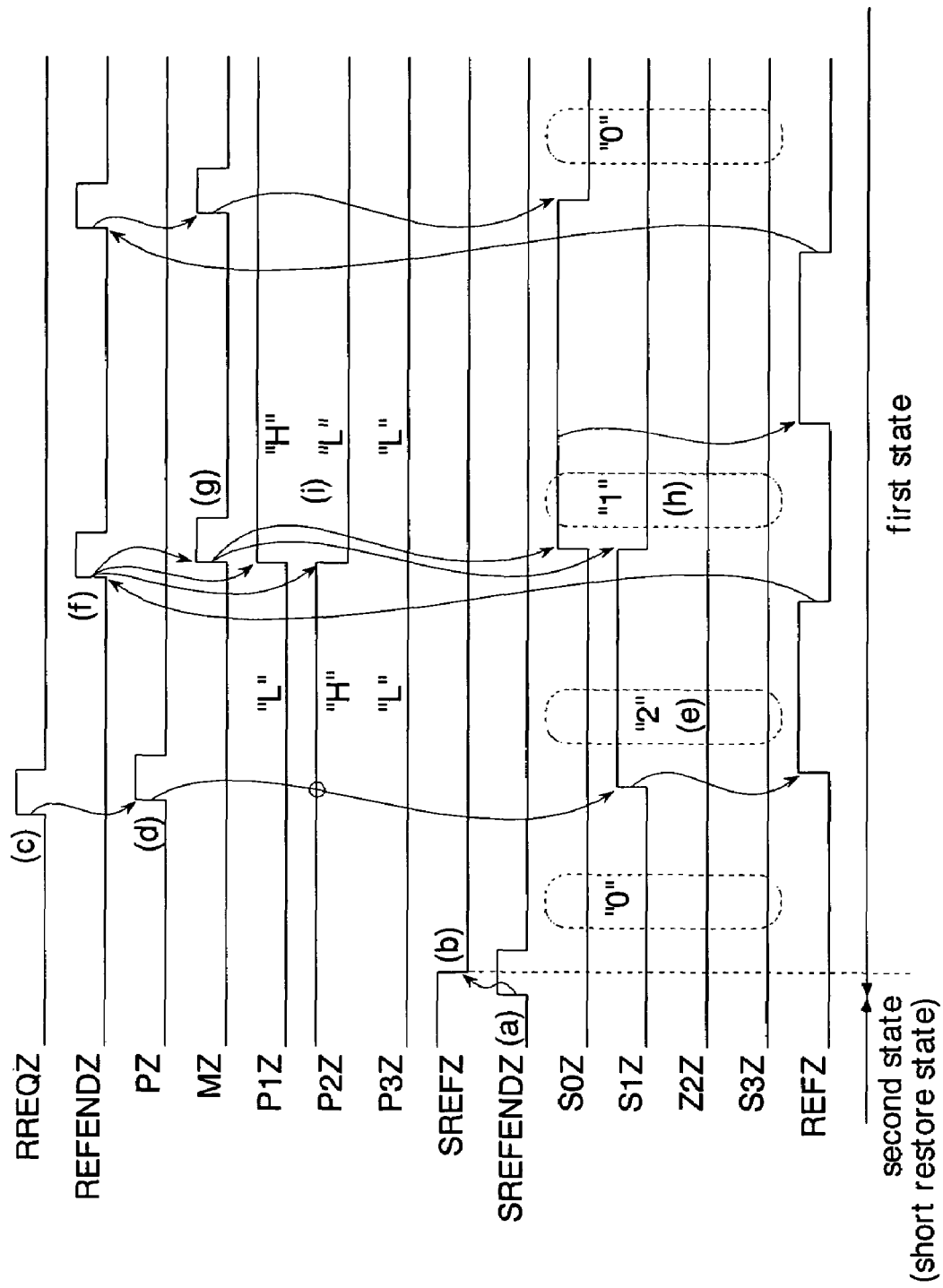
FIG. 7 is a timing chart showing a refresh operation when the operational state of the FCRAM is changed from the second state to the first state in the invention.

FIG. 7 shows the refresh operation when the operation of the FCRAM is changed from the second state to the first state. As mentioned previously, the refresh counter 18 activates the short restore end signal SREFENDZ when the logic level of the uppermost bit REFAD23 of the refresh address REFAD is changed three times after the activation of the short restore signal SREFZ (FIG. 7(a)). The refresh timer 12 deactivates the short restore signal SREFZ in response to the short restore end signal SREFENDZ (FIG. 7(b)). Accordingly, the operational state of the FCRAM is changed from the second state (short restore state) to the first state in which the short restore memory cell does not exist.

Next, the refresh end signal REFENDZ is outputted (FIG. 7(c)) and the plus signal PZ is outputted (FIG. 7(d)). Since the additional value signal P2Z is activated in such a state, the refresh request storing circuit 40 changes the stored value S3Z-S0Z from "0" to "2" in synchronism with the plus signal PZ (FIG. 7(e)). Thereafter, as described above in conjunction with FIG. 6, the refresh operation is continuously performed twice.

In synchronism with the completion of the first refresh operation, the refresh end signal REFENDZ is outputted (FIG. 7(f)). In response to the refresh end signal REFENDZ, the minus signal MZ is outputted (FIG. 7(g)) and the stored value S3Z-S0Z is changed to "1" (FIG. 7(h)). Further, the additional value control circuit 36, since the short restore signal SREFZ is deactivated, deactivates the additional value signal P2Z to "L" in response to the refresh end signal REFENDZ and activates the additional value signal P1Z to "H" (FIG. 7(i)). Therefore, in the succeeding operation, the stored value S3Z-S0Z is changed from "0" to "1" in response to the plus signal PZ. Accordingly, in the same manner as the operation shown in FIG. 5, the refresh operation is performed one time in response to one refresh request signal RREQZ. In this manner, since the short restore memory cell no more exists, the frequency of the refresh operation can be lowered again.

Figure 8:
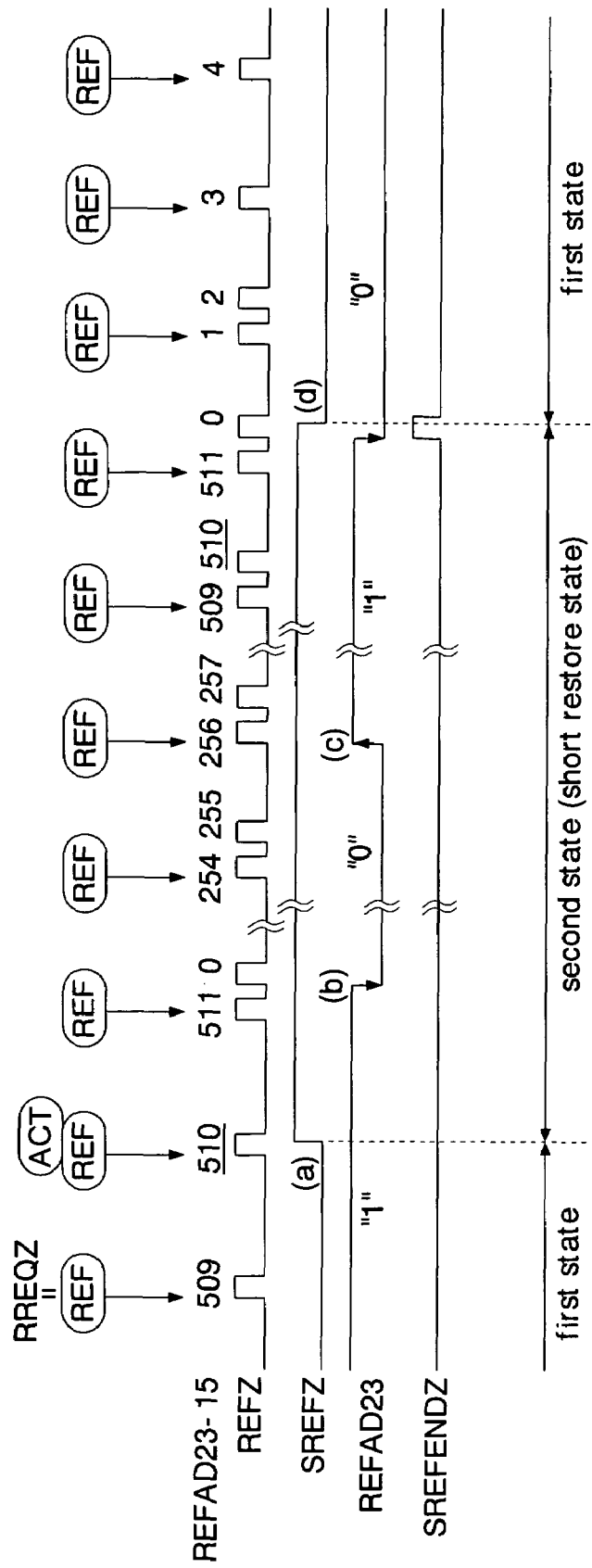
FIG. 8 is a timing chart showing the manner of operation of a refresh counter.

FIG. 8 shows the manner of operation of the refresh counter 18. In the drawing, "REF" indicates the inner refresh request RREQZ and "ACT" indicates the external access request. When the external access request ACT is supplied immediately after the refresh request REF and the refresh operation is interrupted, the short restore signal SREFZ is changed to the high logic level from the low logic level (FIG. 8(a)). In this example, the refresh address REFAD23-15 whose refresh operation is shortened is "510" in decimal number. Here, the uppermost bit REFAD23 of the refresh address REFAD is "1".

The refresh address REFAD is incremented each time the refresh operation is performed. Here, the semiconductor memory may adopt the circuit specification in which the refresh address REFAD is decremented each time the refresh operation is performed. When the refresh address REFAD is changed from "511" to "0", the uppermost bit REFAD23 is changed from "1" to "0" (FIG. 8(b)). In the same manner, when the refresh address REFAD is changed from "255" to "256", the uppermost bit REFAD23 is changed from "0" to "1" (FIG. 8(c)).

When the uppermost bit REFAD23 is again changed from "1" to "0", that is, when the logic level of the uppermost bit REFAD23 is changed three times, the refresh counter 18 activates the short restore end signal SREFENDZ for a predetermined period (FIG. 8(d)).

The next refresh operation which is applied to the refresh address REFAD (="510") in which the refresh operation is shortened is surely performed before the logic level of the uppermost bit REFAD23 is changed three times. Accordingly, when the logic level of the uppermost bit REFAD23 is changed three times, the short restore memory cell having the insufficient charge restore quantity no more exists. Then, the operational state of the FCRAM is changed from the short restore state (second state) to the first state.

As described above, according to the first embodiment, during the second state in which the short restore memory cell having the insufficient charge restore quantity exists, the number of refresh operations performed in response to one refresh request signal RREQZ is increased compared to the number of refresh operations in the first state and hence, it is possible to increase the frequency of the refresh operations during the second state without changing the oscillation cycle of the oscillator 32. The refresh timer 12 can change the generation frequency of the refresh signal REFZ for performing the refresh operation without using the frequency divider and hence, it is possible to prevent the wasteful oscillation of the oscillator 32. Accordingly, the power consumption of the refresh timer 12 can be reduced and hence, the power consumption of the FCRAM can be reduced. Particularly, a standby current of the FCRAM can be reduced.

Figure 9:
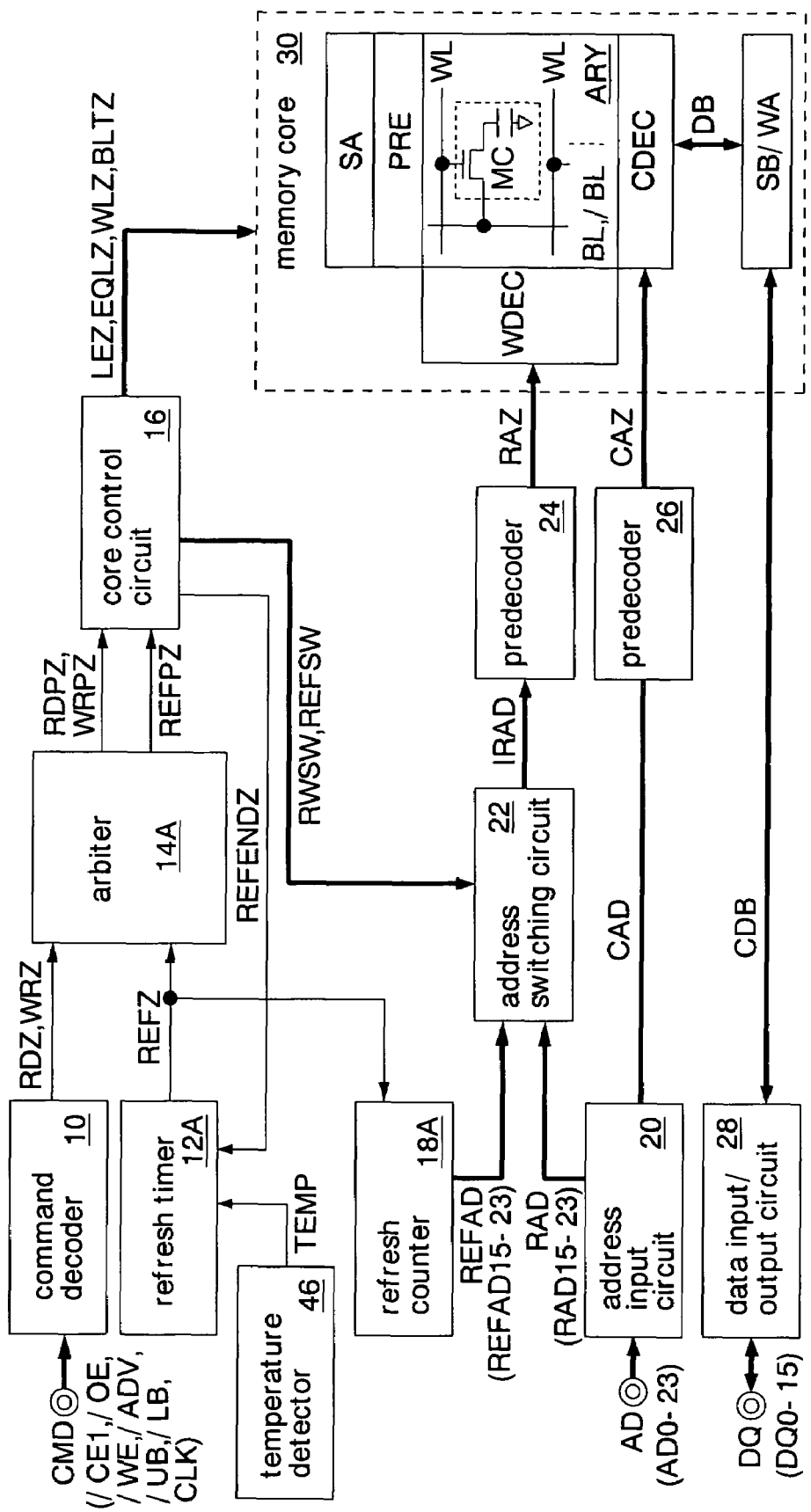
FIG. 9 is a block diagram showing a second embodiment of the semiconductor memory of the invention.

FIG. 9 shows the second embodiment of the semiconductor memory of the invention. Elements identical with the elements explained in the first embodiment are given the same symbols and the detailed explanation of these elements is omitted. In this embodiment, in place of the refresh timer 12, the arbiter 14 and the refresh counter 18 in the first embodiment, a refresh timer 12A, an arbiter 14A and a refresh counter 18A are provided. Further, a temperature detection circuit 46 (temperature detecting unit) is newly provided. Other constitutions are equal to the corresponding constitutions in the first embodiment. That is, the semiconductor memory is formed as a FCRAM using a CMOS technology. The FCRAM is used as a work memory mounted on a mobile phone, for example.

The refresh timer 12A receives a temperature signal TEMP from the temperature detecting circuit 46 in place of the short restore signal SREFZ and the short restore end signal SREFENDZ of the first embodiment. The detail of the refresh timer 12A is explained in conjunction with FIG. 10. The arbiter 14A is formed in a state that a function of generating the short restore signal SREFZ is omitted from the arbiter 14 of the first embodiment.

The refresh counter 18A is formed in a state that the function of counting the change of the logic level of the uppermost bit REFAD23 of the refresh address REFAD is omitted from the refresh counter 18 of the first embodiment.

The temperature detecting circuit 46 sets the temperature signal TEMP at a low logic level when a chip temperature of the FCRAM is equal to or less than a first temperature (for example, 70° C.) and at a high logic level when the chip temperature of the FCRAM exceeds the first temperature.

Figure 10:
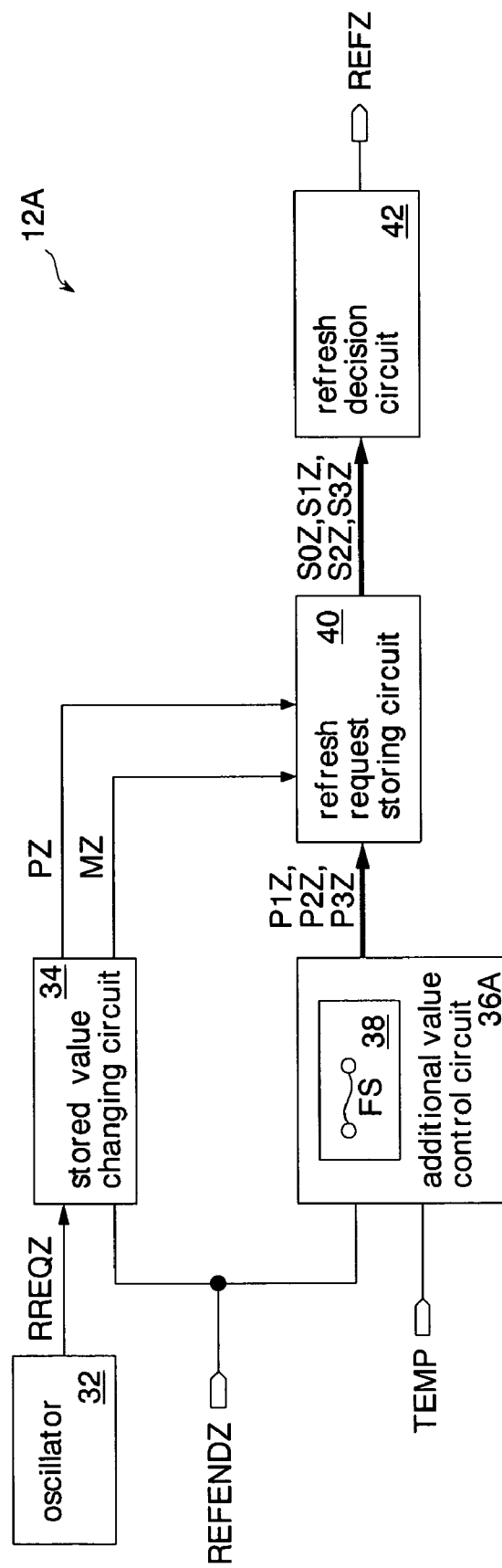
FIG. 10 is a block diagram showing the detail of a refresh timer shown in FIG. 9.

FIG. 10 shows the detail of the refresh timer 12A shown in FIG. 9. The refresh timer 12A includes an oscillator 32, a stored value changing circuit 34, an additional value control circuit 36A, a refresh request storing circuit 40 and a refresh decision circuit 42. The additional value control circuit 36A activates an additional value signal P1Z and deactivates additional value signals P2Z to P3Z during a period that the temperature signal TEMP is held at the low logic level (first state). The additional value control circuit 36A, when a fuse FS is not cut, deactivates the additional value signal P1Z and activates the additional value signal P2Z in response to a change to the high logic level of the temperature signal TEMP (second state). The additional value control circuit 36A, when a fuse FS is cut, deactivates the additional value signal P1Z and activates the additional value signal P3Z in response to a change to the low logic level of the temperature signal TEMP (second state).

In this embodiment, when the chip temperature of the FCRAM is equal to or less than the first temperature, in response to one refresh request signal RREQZ, the refresh operation is performed one time. When the chip temperature of the FCRAM exceeds the first temperature, in response to the refresh request signal RREQZ one time, the refresh operation is continuously performed two or three times.

When the chip temperature is high, the data retention time of the memory cell MC becomes short. Accordingly, it is necessary to increase the frequency of the refresh operation to prevent data of the memory cell MC from being lost. In this embodiment, it is possible to change the frequency of the refresh operations without changing the oscillation frequency (generation frequency of the refresh request signal RREQZ) of the oscillator 32.

Figure 11:
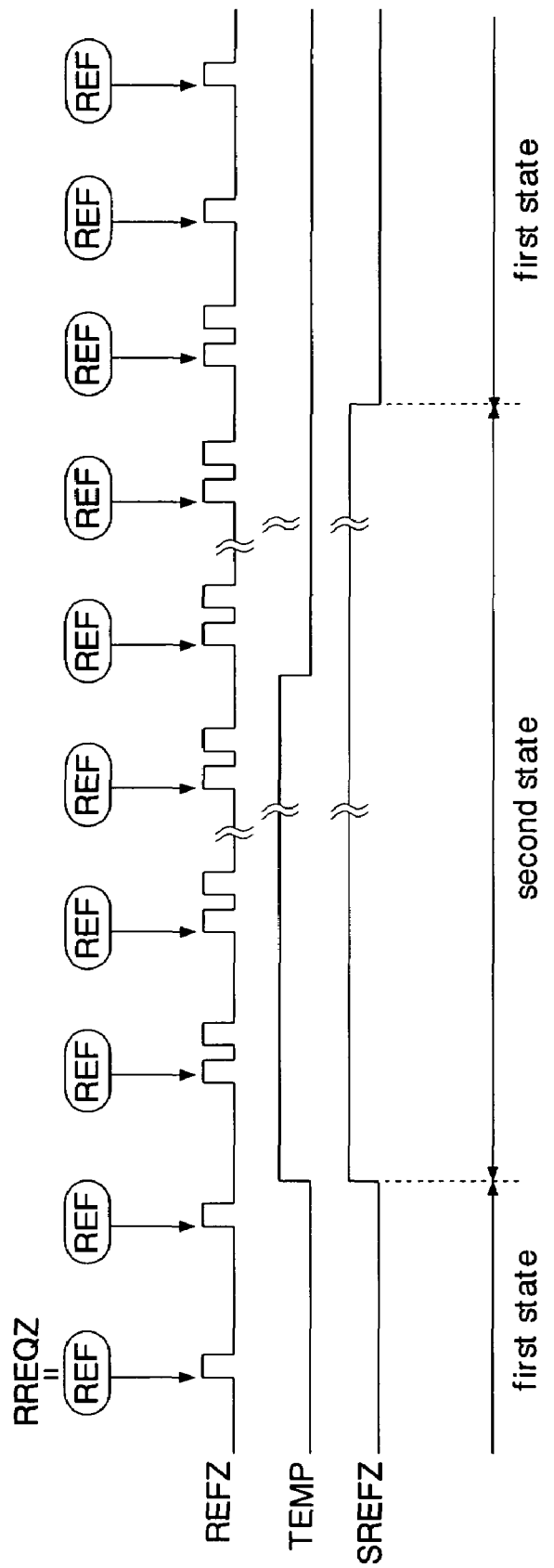
FIG. 11 is a timing chart showing the manner of operation of the refresh timer shown in FIG. 10.

FIG. 11 shows the manner of operation of the refresh timer 12A. The refresh timer 12A sets the short restore signal SREFZ at the low logic level during a period in which the refresh timer 12A receives the temperature signal TEMP of low logic level (first state). The refresh timer 12A sets the short restore signal SREFZ at the high logic level during a period in which the refresh timer 12A receives the temperature signal TEMP of high logic level (second state). Further, the refresh timer 12A changes the short restore signal SREFZ to the low logic level in response to the fact that the temperature signal TEMP is changed from the high logic level to the low logic level and, thereafter, the refresh operation of all memory cells MC is performed. The fact that the temperature signal TEMP is changed from the high logic level to the low logic level and, thereafter, the refresh operation of all memory cells MC is performed may be detected in response to the change of the logic level of the uppermost bit REFAD23 of the refresh counter 18A three times in the same manner as the first embodiment.

As described above, the second embodiment also can obtain substantially equal advantageous effects as the above-mentioned first embodiment. Further, when the chip temperature of the FCRAM rises, it is possible to increase the frequency of the refresh operations without changing the oscillation frequency of the oscillator 32. As a result, it is possible to prevent the data stored in the memory cell from being lost while minimizing the increase of the power consumption.

Here, although the example in which the invention is applied to the FCRAM has been explained in the above-mentioned embodiments, it is possible to obtain the substantially equal advantageous effects even when the invention is applied to a DRAM having a self refreshing function.

It may be possible to combine the first embodiment and the second embodiment so as to change the first state to the second state in response to the shortening of the refresh operation and the temperature elevation. In this case, for example, when either one of the shortening of the refresh operation and the temperature elevation arises, the increment of the stored value S3Z-S0Z is set to "2" (P2Z), while when both of the interruption of the refresh operation and the temperature elevation arise, the increment of the stored value S3Z-S0Z is set to "3" (P3Z).

In the above-mentioned first embodiment, the explanation has been made with respect to the example in which that fact that the refresh operation completes one-round operation is determined when the uppermost bit REFAD23 of the refresh address REFAD is changed three times. For example, the fact that the refresh operation completes one-round operation may be determined by monitoring a plurality of upper bits of the refresh address REFAD23-15. In this case, the period of the second state can be shortened.

In the above-mentioned embodiment, the explanation has been made with respect to the case in which the stored values S3Z-S0Z are increased in synchronism with the refresh request signal RREQZ and the stored values S3Z-S0Z are decreased in synchronism with the refresh end signal REFENDZ, the increase and the decrease may be reversed.

The invention is not limited to the above embodiments and various modifications may be made without departing from the spirit and scope of the invention. Any improvement may be made in part or all of the components.

What is claimed is:

1. A semiconductor memory comprising:
   a memory core which has dynamic memory cells;
   an oscillator which generates a refresh request signal periodically for refreshing said dynamic memory cells;
   a storing circuit which includes a holding part holding a stored value, changes the stored value by a predetermined value so that it goes away from an initial value, in response to said refresh request signal, and changes the stored value by one so that it approaches to the initial value, in response to a refresh operation corresponding to said refresh request signal;
   a state detecting circuit which detects a change of the semiconductor memory from a first state to a second state and from the second state to the first state;
   a store control circuit which increases said predetermined value used by said storing circuit in response to the detection of the change from the first state to the second state by said state detecting circuit, and decreases said predetermined value used by said storing circuit in response to the detection of the change from the second state to the first state by said state detecting circuit;
   a refresh decision circuit which receives the stored value held in said holding part and outputs a number of refresh signals until the stored value returns to the initial value, the number corresponding to the stored value; and
   a core control circuit which allows said memory core to perform the refresh operation in response to each of said refresh signals and allows said memory core to perform an access operation in response to an external access request.

2. The semiconductor memory according to claim 1, wherein:
   said state detecting circuit includes an arbiter allowing said core control circuit to shorten the refresh operation and start the access operation, upon receiving said external access request during the refresh operation which is performed in response to one of said refresh signals, and detects the change from the first state to the second state from the shortening of the refresh operation; and
   said store control circuit increases said predetermined value in response to the detection of the change from the first state to the second state.

3. The semiconductor memory according to claim 2, wherein:
   said memory core includes a plurality of word lines connected with said dynamic memory cells, respectively, and sequentially selected in response to each of said refresh signals for performing the refresh operation;
   said state detecting circuit includes a refresh counter performing a counting operation in synchronism with each of said refresh signals, generating a refresh address to specify one of said word lines, and detecting that the word line corresponding to a shortened refresh operation is reselected for performing the refresh operation, and detects a change from the second state to the first state from the reselection of the word line, the one of said word lines being connected to the dynamic memory cells to be refreshed; and said store control circuit decreases said predetermined value in response to the detection of the change from the second state to the first state.

4. The semiconductor memory according to claim 3, wherein:
said state detecting circuit includes an inversion detecting unit detecting an inversion of a logic level of an uppermost bit of the refresh address, and detects the change from the second state to the first state when said inversion detecting unit detects the inversion of the logic level three times; and
said store control circuit decreases said predetermined value in response to the detection of the change from the second state to the first state.

5. The semiconductor memory according to claim 1, wherein
said state detecting circuit includes a temperature detecting unit detecting a temperature of the semiconductor memory, and detects a change from the first state to the second state when the temperature detected by said temperature detecting unit exceeds a preset value, and
said store control circuit increases said preset value in response to the detection of the change from the first state to the second state.

6. The semiconductor memory according to claim 1, wherein said oscillator includes:

a current source;
a capacitor charged with a charge supplied from said current source and generating an output voltage in accordance with an amount of the charge;
a refresh request generator which generates said refresh request signal when said output voltage exceeds a reference voltage; and
a discharge circuit which discharges the charge of said capacitor in synchronism with the generation of said refresh request signal.

7. The semiconductor memory according to claim 1, wherein said store control circuit includes a program circuit which sets said predetermined value to any one of a plurality of values.

8. The semiconductor memory according to claim 1, wherein:
said core control circuit outputs a refresh end signal in response to completion of said refresh operation; and
said storing circuit changes, in synchronism with said refresh end signal, the stored value by one so that it approaches to the initial value.

* * * * *